United States Patent
Matsuda et al.

(10) Patent No.: US 10,212,801 B2
(45) Date of Patent: Feb. 19, 2019

(54) MOTOR DRIVING DEVICE

(71) Applicant: FANUC CORPORATION, Yamanashi (JP)

(72) Inventors: Ryou Matsuda, Yamanashi-ken (JP); Shinichi Mizukami, Yamanashi-ken (JP); Naoki Masuda, Yamanashi-ken (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 15/948,047

(22) Filed: Apr. 9, 2018

(65) Prior Publication Data
US 2018/0295709 A1    Oct. 11, 2018

(30) Foreign Application Priority Data

Apr. 10, 2017    (JP) .................. 2017-077498

(51) Int. Cl.
*H05K 1/02*    (2006.01)
*H05K 7/20*    (2006.01)
*F28F 13/02*    (2006.01)

(52) U.S. Cl.
CPC ......... *H05K 1/0201* (2013.01); *H05K 1/0203* (2013.01); *H05K 7/20145* (2013.01); *H05K 7/20154* (2013.01); *F28F 13/02* (2013.01)

(58) Field of Classification Search
CPC . F28F 13/02; H05K 7/20145; H05K 7/20154; H05K 1/0203
See application file for complete search history.

(56) References Cited

U.S. PATENT DOCUMENTS

| | | | | |
|---|---|---|---|---|
| 7,505,274 B2* | 3/2009 | Yu | .............. | H01L 23/4006 165/80.3 |
| 2009/0316365 A1* | 12/2009 | Lin | .............. | H01L 23/427 361/711 |
| 2015/0362262 A1 | 12/2015 | Sekikawa | | |

FOREIGN PATENT DOCUMENTS

| | | |
|---|---|---|
| JP | 63220600 A | 9/1988 |
| JP | 2007165793 A | 6/2007 |
| JP | 20164891 A | 1/2016 |

OTHER PUBLICATIONS

English Abstract and Machine Translation for Japanese Publication No. 2016004891 A, published Jan. 12, 2016, 1 pg.

(Continued)

*Primary Examiner* — Adrian S Wilson
(74) *Attorney, Agent, or Firm* — Fredrikson & Byron, P.A.

(57) ABSTRACT

A motor driving device is equipped with a narrow pitch component group made up from a plurality of narrow pitch components having a plurality of terminals, and in which an interval between the plurality of terminals is less than or equal to a predetermined distance, a heat generating component group made up from a plurality of heat generating components, which are components other than the narrow pitch components, and which generate heat greater than or equal to a predetermined amount, a fan configured to blow wind onto the heat generating component group in order to cool the heat generating component group, and a printed board on which the narrow pitch component group is mounted in a manner so that wind is not blown onto the narrow pitch component group by the fan.

6 Claims, 7 Drawing Sheets

(56) References Cited

OTHER PUBLICATIONS

English Abstract and Machine Translation for Japanese Publication No. 2007-165793 A, published Jun. 28, 2007, 9 pgs.
English Abstract and Machine Translation for Japanese Publication No. JPS63220600 A, published Sep. 13, 1988, 6 pgs.

* cited by examiner

FIG. 7
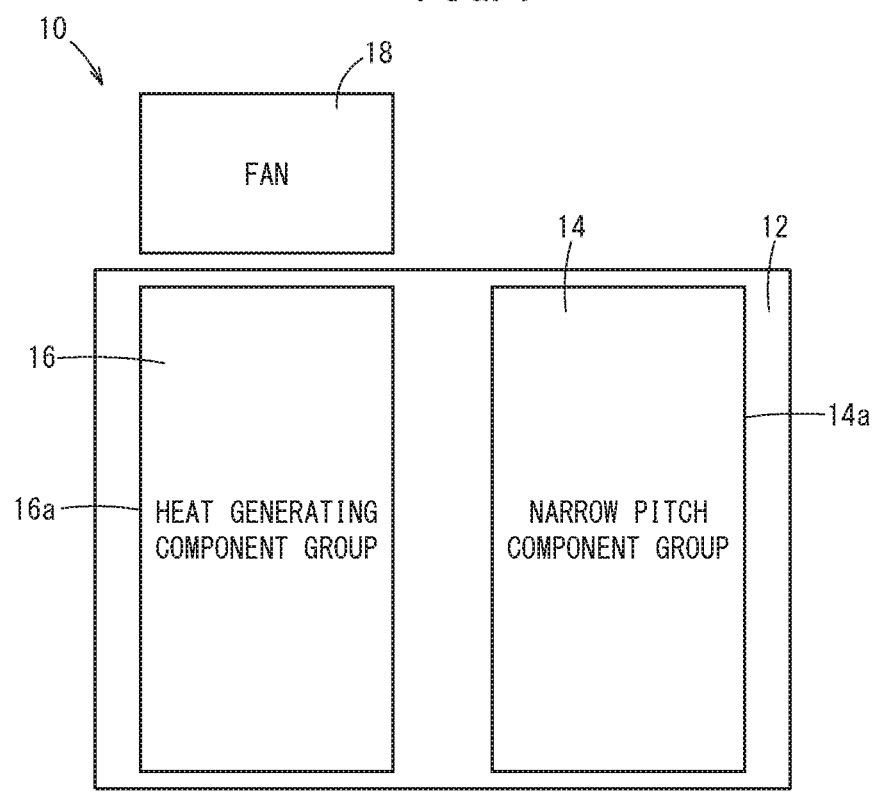
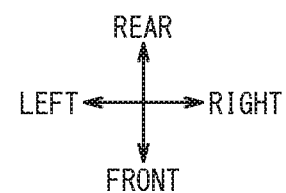

MOTOR DRIVING DEVICE

CROSS-REFERENCE TO RELATED APPLICATION

This application is based upon and claims the benefit of priority from Japanese Patent Application No. 2017-077498 filed on Apr. 10, 2017, the contents of which are incorporated herein by reference.

BACKGROUND OF THE INVENTION

Field of the Invention

The present invention relates to a motor driving device for driving a motor.

Description of the Related Art

In Japanese Laid-Open Patent Publication No. 2016-004891, a cooling device is disclosed. According to Japanese Laid-Open Patent Publication No. 2016-004891, in the case that the cooling device is disposed in a control panel in an environment in which a cutting fluid mist exists, in order to prevent electronic components from breaking down or malfunctioning due to wind that includes the cutting fluid mist therein and which is blown from the cooling device, it is disclosed to provide a mist collecting member in the cooling device to capture and collect the mist.

SUMMARY OF THE INVENTION

However, in Japanese Laid-Open Patent Publication No. 2016-004891, the structure of the cooling device is complicated.

Thus, the present invention has the object of providing a motor driving device, which with a simple configuration, is capable of preventing malfunctioning or failure of electronic components while heat generating components in the motor driving device are cooled.

An aspect of the present invention is characterized by a motor driving device comprising a narrow pitch component group made up from a plurality of narrow pitch components having a plurality of terminals, and in which an interval between the plurality of terminals is less than or equal to a predetermined distance, a heat generating component group made up from a plurality of heat generating components, which are components other than the narrow pitch components, and which are configured to generate heat greater than or equal to a predetermined amount, a fan configured to blow wind onto the heat generating component group in order to cool the heat generating component group, and a printed board on which the narrow pitch component group is mounted in a manner so that wind is not blown onto the narrow pitch component group by the fan.

According to the present invention, with a simple configuration, it is possible to prevent the wind blown by the fan from flowing to the narrow pitch component group, while also cooling the heat generating components by the wind blown from the fan. Accordingly, it is possible to prevent the narrow pitch components from malfunctioning due to atomized liquid contained within the wind blown by the fan.

The above and other objects, features, and advantages of the present invention will become more apparent from the following description when taken in conjunction with the accompanying drawings, in which preferred embodiments of the present invention are shown by way of illustrative example.

BRIEF DESCRIPTION OF THE DRAWINGS

FIG. 7 is a plan view showing an exemplary schematic configuration of a motor driving device according to a fourth embodiment of the present invention.

DESCRIPTION OF THE PREFERRED EMBODIMENTS

Preferred embodiments of a motor driving device according to the present invention will be presented and described in detail below with reference to the accompanying drawings.

First Embodiment

Figure 1:
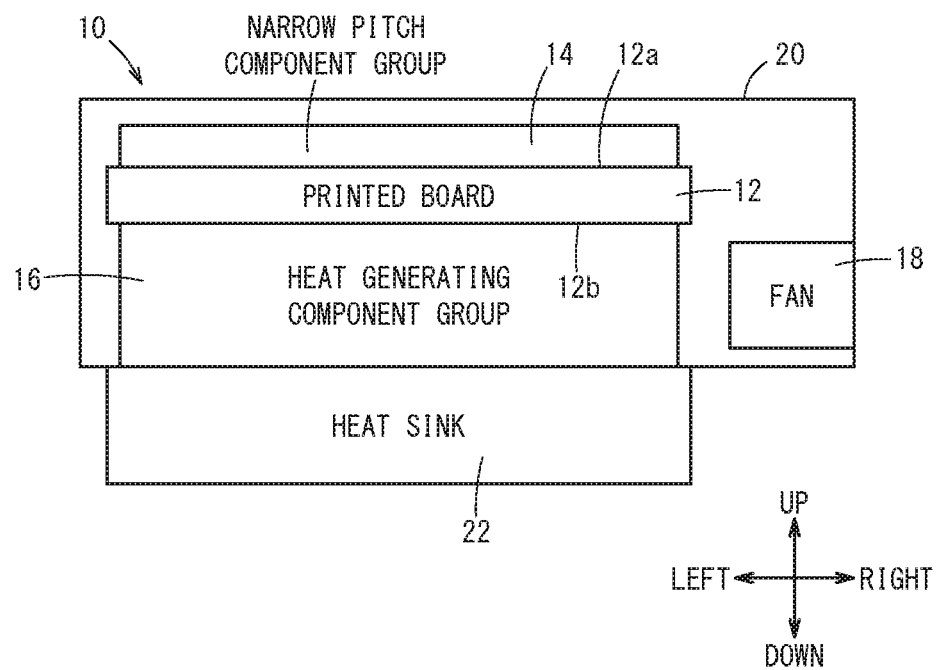
FIG. 1 is a side view showing an exemplary schematic configuration of a motor driving device according to a first embodiment of the present invention.

FIG. 1 is a side view showing an exemplary schematic configuration of a motor driving device 10 according to a first embodiment. In the following description, up, down, left and right directions will be explained in accordance with the directions of the arrows shown in FIG. 1. The motor driving device 10 that drives a motor includes a printed board 12, a narrow pitch component group 14 made up from a plurality of narrow pitch components, a heat generating component group 16 made up from a plurality of heat generating components, a fan 18 configured to blow wind onto the heat generating component group 16 and cool the heat generating component group 16, and a housing 20 in which the printed board 12, the narrow pitch component group 14, the heat generating component group 16, and the fan 18 are accommodated. The printed board 12, the narrow pitch component group 14, and the heat generating component group 16 are elements that serve to drive the motor. Moreover, the wind blown by the fan 18 includes an atomized liquid (for example, a liquid such as cutting fluid composed of oil, water, or the like). Hereinafter, the atomized liquid will be referred to simply as a mist.

Figure 2:
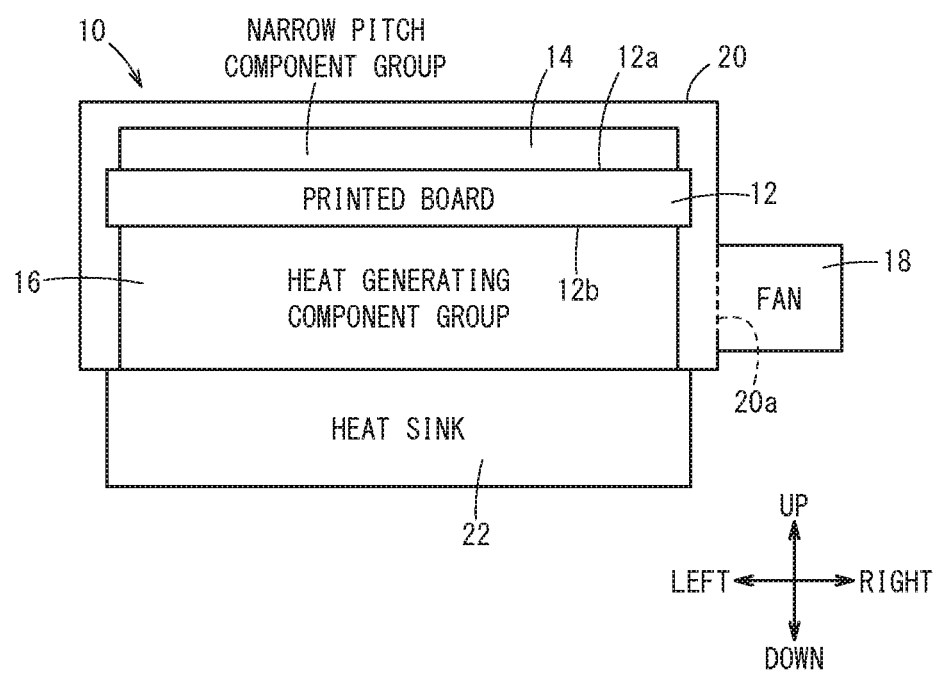
FIG. 2 is a diagram showing another example of the motor driving device shown in FIG. 1.

As shown in FIG. 2, the fan 18 may be disposed outside of the housing 20. In the case that the fan 18 is disposed externally of the housing 20, it is necessary that a ventilation opening 20a be provided in the housing 20 through which the wind blown by the fan 18 flows into the housing 20.

A heat sink 22 is attached to the motor driving device 10. The heat sink 22 serves to cool the heat generating component group 16. Accordingly, the heat sink 22 is disposed on a side of the heat generating component group 16. Although the heat sink 22 may be disposed outside of the housing 20, or may also be disposed inside the housing 20, according to the first embodiment, the heat sink 22 is disposed externally of the housing 20. Moreover, although not shown, a fan that blows wind onto the heat sink 22 may be separately provided.

In this instance, the narrow pitch components are components having a plurality of terminals (not shown), and in which an interval between the terminals is less than or equal to a predetermined distance (for example, 2 mm). For example, the narrow pitch components are ICs (Integrated Circuits) in which a distance between the terminals is less than or equal to the predetermined distance. The narrow pitch components are electronic components that are likely to malfunction due to the mist, and the amount of heat generated thereby is less than a predetermined amount. Such malfunctioning or failure is caused, for example, due to insufficient insulation.

The heat generating components are components other than the narrow pitch components, and are components that generate heat greater than or equal to a predetermined amount. The heat generating components, for example, are components which are provided in order to supply a large driving current to the motor, and are constituted by power devices, bus bars, or the like. The power devices are power semiconductor elements made up of insulated gate bipolar transistors (IGBT), thyristors, rectifier diodes, or power transistors (power MOSFET). The heat generating component group 16 may also include intelligent power modules (IPM). The heat generating components are components which are unlikely to experience malfunctioning due to the mist.

The narrow pitch component group 14 is mounted on one surface 12a of the printed board 12, and the heat generating component group 16 is disposed on a surface (opposite surface) 12b side of the printed board 12 opposite from the one surface 12a. Hereinafter, the one surface 12a of the printed board 12 on which the narrow pitch component group 14 is mounted will be referred to as a front surface (printed surface), and the surface (opposite surface) 12b on the side where the heat generating component group 16 and the fan 18 are disposed will be referred to as a rear surface (solder surface).

The heat generating component group 16 may be supported by the printed board 12 or may be supported by the housing 20. At this time, signal lines for outputting command signals from the narrow pitch components to the heat generating components are electrically connected to the narrow pitch components and the heat generating components, however, because the signal lines do not generate heat that is greater than or equal to a predetermined amount, such signal lines are not included in either the narrow pitch components or the heat generating components.

Figure 3:
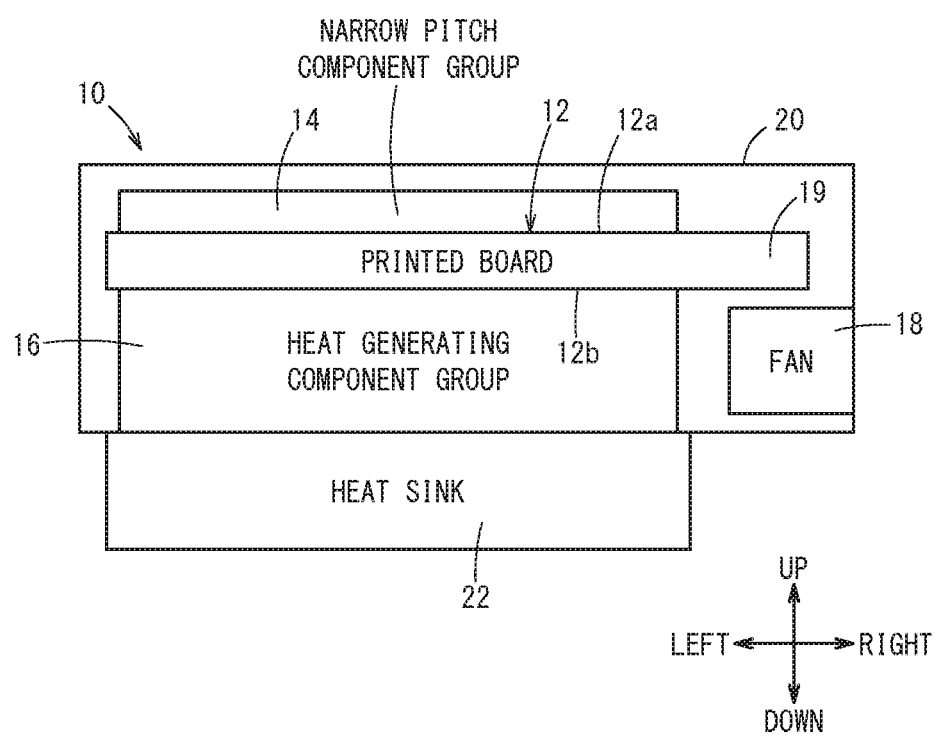
FIG. 3 is a diagram showing still another example of the motor driving device shown in FIG. 1.

The fan 18 is disposed on the rear surface 12b side of the printed board 12. In accordance with this feature, it is possible to prevent the wind that is blown from the fan 18 from flowing to the narrow pitch component group 14, together with enabling the wind blown from the fan 18 to flow toward the heat generating component group 16. Moreover, as shown in FIG. 3, by the printed board 12 being extended to an area above the fan 18, it is possible to prevent the wind blown from the fan 18 from flowing to the narrow pitch component group 14, and to guide the wind blown from the fan 18 so as to flow toward the heat generating component group 16. In this case, a portion 19 of the printed board 12 that extends above the fan 18 functions as a guiding member.

In this manner, the narrow pitch component group 14 is mounted on the printed board 12 in a manner so that wind is not blown by the fan 18 onto the narrow pitch component group 14. More specifically, the heat generating component group 16 and the fan 18 are disposed on the rear surface 12b on an opposite side from the front surface 12a of the printed board 12 on which the narrow pitch component group 14 is mounted. Consequently, it is possible to prevent the wind (including the mist) blown by the fan 18 from flowing to the narrow pitch component group 14, and to prevent the narrow pitch components from breaking down or malfunctioning due to the wind blown from the fan 18.

Second Embodiment

Figure 4:
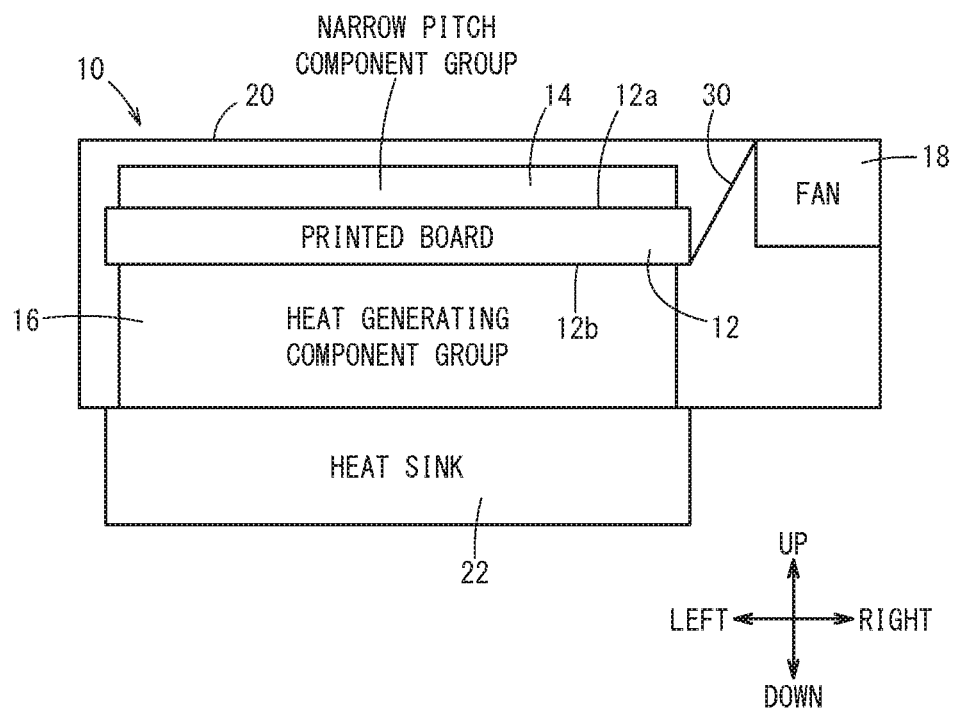
FIG. 4 is a side view showing an exemplary schematic configuration of a motor driving device according to a second embodiment of the present invention.

FIG. 4 is a side view showing an exemplary schematic configuration of a motor driving device 10 according to a second embodiment. Components that are the same or similar to those of the first embodiment are denoted with the same reference numerals, and points that differ from the first embodiment will be described below. In the second embodiment as well, the narrow pitch component group 14 is mounted on the printed board 12 in a manner so that wind is not blown by the fan 18 onto the narrow pitch component group 14.

According to the first embodiment, the fan 18 is disposed on the rear surface 12b side of the printed board 12. However, in the second embodiment, the fan 18 may be disposed on the front surface 12a side of the printed board 12. In this case, the wind blown by the fan 18 would flow disadvantageously onto the narrow pitch component group 14. Thus, in the second embodiment, the guiding member 30 is provided in the interior of the housing 20, so as to block the wind blown from the fan 18 from flowing to the narrow pitch component group 14, and to guide the wind blown from the fan 18 toward the heat generating component group 16.

Consequently, it is possible to reliably prevent the wind including the mist blown by the fan 18 from flowing to the narrow pitch component group 14, and to reliably prevent the narrow pitch components from breaking down or malfunctioning due to the wind blown from the fan 18.

Figure 5:
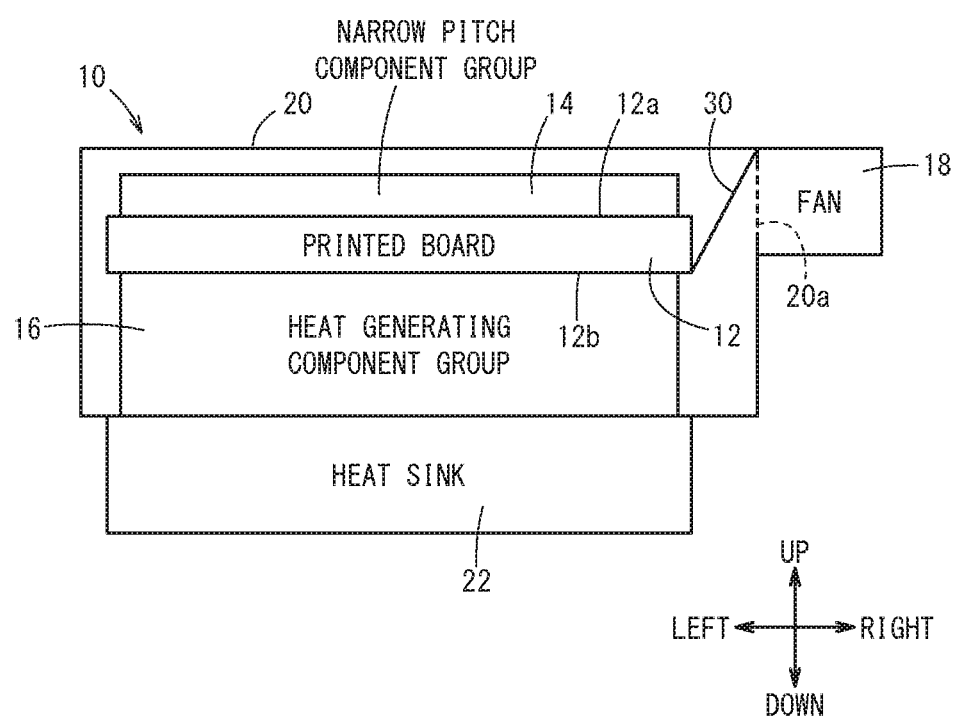
FIG. 5 is a diagram showing another example of the motor driving device shown in FIG. 4.

Moreover, similar to the case in which the fan 18 is disposed externally of the housing 20, the guiding member 30 is provided, which blocks the wind blown from the fan 18 in the interior of the housing 20 from flowing to the narrow pitch component group 14, and guides the wind blown from the fan 18 so as to flow toward the heat generating component group 16. In this case, as shown in FIG. 5, the guiding member 30 guides the wind, which flows from the ventilation opening 20a formed in the housing 20, so as to flow toward the heat generating component group 16.

Further, a configuration may be provided in which the guiding member 30 is simply disposed in the motor driving device 10 described in the aforementioned first embodiment. In other words, the guiding member 30 may also be provided in a configuration in which the fan 18 is disposed on the rear surface 12b side of the printed board 12. In accordance with this feature, it is possible to reliably prevent the wind blown by the fan 18 from flowing onto the narrow pitch component group 14.

Third Embodiment

Figure 6:
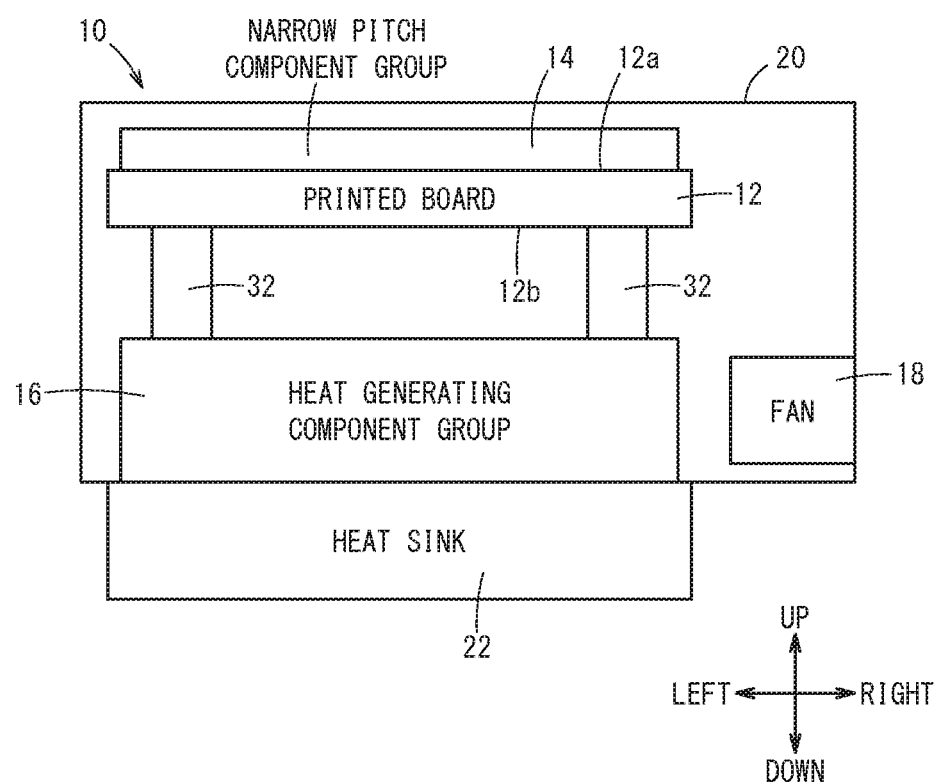
FIG. 6 is a side view showing an exemplary schematic configuration of a motor driving device according to a third embodiment of the present invention.

FIG. 6 is a side view showing an exemplary schematic configuration of a motor driving device 10 according to a third embodiment. Components that are the same or similar to those of the first embodiment are denoted with the same reference numerals, and points that differ from the first embodiment will be described below. In the third embodiment as well, the narrow pitch component group 14 is mounted on the printed board 12 in a manner so that wind is not blown by the fan 18 onto the narrow pitch component group 14.

According to the third embodiment, the heat generating component group 16 is arranged while being separated at a predetermined distance from the printed board 12. The heat generating component group 16 is disposed on the printed board 12 via connecting members 32. The connecting members 32 are interposed between the printed board 12 and the heat generating component group 16, in order to set the distance between the printed board 12 and the heat generating component group 16 at a predetermined distance. Signal lines for outputting command signals from the narrow pitch components to the heat generating components may be provided in the connecting members 32.

In accordance with such a configuration, since the installation position of the fan 18 can be separated from the printed board 12, it is possible to prevent the wind (including the mist) that is blown from the fan 18 from flowing to the narrow pitch component group 14, together with enabling the wind blown from the fan 18 to flow toward the heat generating component group 16. Accordingly, it is possible to reliably prevent the narrow pitch components from malfunctioning due to the wind blown from the fan 18.

In the example shown in FIG. 6, the printed board 12 and the heat generating component group 16 are separated by interposing the connecting members 32 therebetween, however, the connecting members 32 need not necessarily be provided. In this case, the heat generating component group 16 may be supported by the housing 20. Thus, in essence, the printed board 12 and the heat generating component group 16 may be separated by a predetermined distance.

In the third embodiment as well, the guiding member 30 that was described in the aforementioned second embodiment may also be provided. In accordance with this feature, it is possible to reliably prevent the wind blown by the fan 18 from flowing onto the narrow pitch component group 14.

Fourth Embodiment

FIG. 7 is a plan view showing an exemplary schematic configuration of a motor driving device 10 according to a fourth embodiment. Components that are the same or similar to those of the first embodiment are denoted with the same reference numerals, and points that differ from the first embodiment will be described below. In the fourth embodiment as well, the narrow pitch component group 14 is mounted on the printed board 12 in a manner so that wind is not blown by the fan 18 onto the narrow pitch component group 14. In FIG. 7, illustration of the housing 20 and the heat sink 22 is omitted.

According to the fourth embodiment, the narrow pitch component group 14 is arranged at one end side (right side) in a predetermined direction (left/right direction) of the printed board 12, and the heat generating component group 16 is arranged at another end side (left side) in the predetermined direction (left/right direction) of the printed board 12. As viewed in plan, a first region 14a in which the narrow pitch component group 14 is arranged, and a second region 16a in which the heat generating component group 16 is arranged are separated from each other by a predetermined interval along the predetermined direction (left/right direction). According to the fourth embodiment, the narrow pitch component group 14 is mounted on the front surface 12a of the printed board 12, and the heat generating component group 16 is disposed on the front surface 12a side of the printed board 12.

As viewed in plan, the fan 18 blows the wind in a direction (front/rear direction) perpendicular to the predetermined direction (left/right direction), and thereby cools the heat generating component group 16. Therefore, the fan 18 is arranged on the front side or the rear side of the heat generating component group 16. In the example shown in FIG. 7, an example is shown in which the fan 18 is installed on the rear side of the heat generating component group 16.

In accordance with this feature, it is possible to prevent the wind (including the mist) that is blown by the fan 18 from flowing to the narrow pitch component group 14, together with enabling the wind blown from the fan 18 to flow toward the heat generating component group 16. Accordingly, it is possible to prevent the narrow pitch components from malfunctioning due to the wind blown from the fan 18.

Moreover, as was described in relation to the aforementioned first through third embodiments, the narrow pitch component group 14 may be mounted on the front surface 12a of the printed board 12, and the heat generating component group 16 may be disposed on the rear surface 12b side of the printed board 12. In this case, it is possible to more effectively prevent the wind blown by the fan 18 from flowing to the narrow pitch component group 14, and to more effectively prevent the narrow pitch components from breaking down or malfunctioning due to the wind blown from the fan 18.

Further, in the fourth embodiment as well, the guiding member 30 that was described in the aforementioned second embodiment may also be provided. In accordance with this feature, it is possible to reliably prevent the wind blown by the fan 18 from flowing onto the narrow pitch component group 14. Further, in the fourth embodiment as well, as described in connection with the aforementioned third embodiment, the printed board 12 and the heat generating component group 16 may be arranged while being separated from each other by a predetermined distance.

[Modifications]

The motor driving device 10 described in each of the respective embodiments above may be a device configured to drive motors of each of respective axes (for example, respective axes such as an X-axis, a Y-axis, and a Z-axis, etc.). In this case, the narrow pitch component group 14, the heat generating component group 16, and the fan 18 are provided for each of the motors of the respective axes.

For example, in the case that the motor driving device 10 is configured as shown in FIGS. 1 to 6, the narrow pitch component group 14, the heat generating component group 16, and the fan 18, which are provided for each of the motors of the respective axes, may be arranged along the front/rear direction at units of the axes. Further, in the case that the motor driving device 10 is configured as shown in FIG. 7, the narrow pitch component group 14, the heat generating component group 16, and the fan 18, which are provided for each of the motors of the respective axes, may be arranged along the left/right direction at units of the axes.

The narrow pitch component group 14, the heat generating component group 16, and the fan 18, which are provided for each of the motors of the respective axes, are accommodated inside the housing 20 of the motor driving device 10. A printed board 12 may be provided for each of the motors of the respective axes, or a single printed board 12 may be used in common.

[Technical Concepts Obtained from the Embodiments]

Technical concepts which can be grasped from the above-described respective embodiments will be described below.

The motor driving device (10) is equipped with the narrow pitch component group (14) made up from the plurality of narrow pitch components having a plurality of terminals, and in which an interval between the plurality of terminals is less than or equal to a predetermined distance, the heat generating component group (16) made up from the plurality of heat generating components, which are components other than the narrow pitch components, and which are configured to generate heat greater than or equal to a predetermined amount, the fan (18) configured to blow wind onto the heat generating component group (16) in order to cool the heat generating component group (16), and the printed board (12) on which the narrow pitch component group (14) is mounted in a manner so that wind is not blown onto the narrow pitch component group (14) by the fan (18).

In accordance with this feature, with a simple configuration, it is possible to prevent the wind blown by the fan (18) from flowing to the narrow pitch component group (14), while also cooling the heat generating components by the wind blown from the fan (18). Accordingly, it is possible to prevent the narrow pitch components from malfunctioning due to the wind blown from the fan (18). Further, it is possible to prevent an increase in the size of the motor driving device (10).

The narrow pitch component group (14) may be mounted on the one surface (12*a*) of the printed board (12), and the heat generating component group (16) and the fan (18) may be disposed on a side on the opposite surface (12*b*) of the printed board (12) from the one surface (12*a*). In accordance with this feature, with a simple configuration, it is possible to prevent the wind blown by the fan (18) from flowing to the narrow pitch component group (14), while also cooling the heat generating components by the wind blown from the fan (18). Accordingly, it is possible to prevent the narrow pitch components from malfunctioning due to the wind blown from the fan (18).

The heat generating component group (16) may be arranged while being separated at a predetermined distance from the printed board (12). In accordance with this feature, with a simple configuration, it is possible to more effectively prevent the wind blown by the fan (18) from flowing to the narrow pitch component group (14), while also cooling the heat generating components by the wind blown from the fan (18). Accordingly, it is possible to more effectively prevent the narrow pitch components from malfunctioning due to the wind blown from the fan (18).

The guiding member (19, 30) may be provided, which is configured to block the wind blown from the fan (18) from flowing to the narrow pitch component group (14), and to guide the wind blown from the fan (18) toward the heat generating component group (16). In accordance with this feature, with a simple configuration, it is possible to reliably prevent the wind blown by the fan (18) from flowing to the narrow pitch component group (14), while also cooling the heat generating components by the wind blown from the fan (18). Accordingly, it is possible to reliably prevent the narrow pitch components from malfunctioning due to the wind blown from the fan (18).

The narrow pitch component group (14) may be arranged at one end side (right side) in a predetermined direction (left/right direction) of the printed board (12), and the heat generating component group (16) may be arranged at another end side (left side) in the predetermined direction (left/right direction) of the printed board (12). As viewed in plan, the first region (14*a*) in which the narrow pitch component group (14) is arranged, and the second region (16*a*) in which the heat generating component group (16) is arranged, may be separated from each other by a predetermined interval along the predetermined direction (left/right direction). As viewed in plan, the fan (18) may be configured to blow the wind in a direction (front/rear direction) perpendicular to the predetermined direction (left/right direction), and thereby to cool the heat generating component group (16). In accordance with this feature, with a simple configuration, it is possible to prevent the wind blown by the fan (18) from flowing to the narrow pitch component group (14), while also cooling the heat generating components by the wind blown from the fan (18). Accordingly, it is possible to prevent the narrow pitch components from malfunctioning due to the wind blown from the fan (18).

The motor driving device (10) may be configured to drive the motors of each of respective axes, and the narrow pitch component group (14), the heat generating component group (16), and the fan (18) may be provided for each of the motors of the respective axes. In accordance with this feature, one motor driving device (10) can drive each of the motors of the respective axes. Further, with a simple configuration, it is possible to prevent the narrow pitch component groups (14) of the respective axes from malfunctioning due to cooling of the heat generating component groups (16) of the respective axes.

The present invention is not limited to the above described embodiments. It is a matter of course that various modifications can be made without departing from the gist of the present invention.

What is claimed is:

1. A motor driving device comprising:
   a narrow pitch component group made up from a plurality of narrow pitch components having a plurality of terminals, and in which an interval between the plurality of terminals is less than or equal to a predetermined distance;
   a heat generating component group made up from a plurality of heat generating components, which are components other than the narrow pitch components, and which are configured to generate heat greater than or equal to a predetermined amount;
   a fan configured to blow wind onto the heat generating component group in order to cool the heat generating component group; and
   a printed board on which the narrow pitch component group is mounted in a manner so that wind is not blown onto the narrow pitch component group by the fan.

2. The motor driving device according to claim 1, wherein:
   the narrow pitch component group is mounted on one surface of the printed board; and
   the heat generating component group and the fan are disposed on a side on an opposite surface of the printed board from the one surface.

3. The motor driving device according to claim 2, wherein the heat generating component group is arranged while being separated at a predetermined distance from the printed board.

4. The motor driving device according to claim 1, further comprising a guiding member configured to block the wind blown from the fan from flowing to the narrow pitch component group, and to guide the wind blown from the fan toward the heat generating component group.

5. The motor driving device according to claim 1, wherein:
   the narrow pitch component group is arranged at one end side in a predetermined direction of the printed board;
   the heat generating component group is arranged at another end side in the predetermined direction of the printed board;
   as viewed in plan, a first region in which the narrow pitch component group is arranged, and a second region in which the heat generating component group is arranged, are separated from each other by a predetermined interval along the predetermined direction; and
   as viewed in plan, the fan is configured to blow the wind in a direction perpendicular to the predetermined direction, and thereby to cool the heat generating component group.

6. The motor driving device according to claim 1, wherein:
   the motor driving device is configured to drive motors of each of respective axes; and
   the narrow pitch component group, the heat generating component group, and the fan are provided for each of the motors of the respective axes.

* * * * *